United States Patent
Chang et al.

(10) Patent No.: US 10,396,048 B2
(45) Date of Patent: Aug. 27, 2019

(54) CONTACT HOLE STRUCTURE AND FABRICATING METHOD OF CONTACT HOLE AND FUSE HOLE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW); Chin-Hsin Chiu, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/854,785

(22) Filed: Dec. 27, 2017

(65) Prior Publication Data
US 2018/0190603 A1    Jul. 5, 2018

(30) Foreign Application Priority Data

Dec. 29, 2016   (CN) .......................... 2016 1 1247351

(51) Int. Cl.
*H01L 23/485* (2006.01)
*H01L 23/00* (2006.01)
(Continued)

(52) U.S. Cl.
CPC ........ *H01L 24/03* (2013.01); *H01L 21/76816* (2013.01); *H01L 21/76831* (2013.01);
(Continued)

(58) Field of Classification Search
CPC ......... H01L 21/76816; H01L 21/76829; H01L 21/76831; H01L 21/76832; H01L 23/485; H01L 23/5226; H01L 23/5283; H01L 23/5329; H01L 23/53295; H01L 23/62; H01L 24/05; H01L 2224/05009; H01L 2224/05011; H01L 2224/05016;
(Continued)

(56) References Cited

U.S. PATENT DOCUMENTS 5,573,962 A * 11/1996 Sung ............... H01L 21/823814
                                                            257/E21.634
6,586,323 B1 * 7/2003 Fan ........................ H01L 24/11
                                                            257/E21.508
(Continued)

*Primary Examiner* — Stephen W Smoot
(74) *Attorney, Agent, or Firm* — Winston Hsu

(57) ABSTRACT

A method of fabricating a contact hole and a fuse hole includes providing a dielectric layer. A conductive pad and a fuse are disposed within the dielectric layer. Then, a first mask is formed to cover the dielectric layer. Later, a first removing process is performed by taking the first mask as a mask to remove part the dielectric layer to form a first trench. The conductive pad is disposed directly under the first trench and does not expose through the first trench. Subsequently, the first mask is removed. After that, a second mask is formed to cover the dielectric layer. Then, a second removing process is performed to remove the dielectric layer directly under the first trench to form a contact hole and to remove the dielectric layer directly above the fuse by taking the second mask as a mask to form a fuse hole.

11 Claims, 5 Drawing Sheets

(51) Int. Cl.
*H01L 21/66* (2006.01)
*H01L 23/525* (2006.01)
*H01L 21/768* (2006.01)
*H01L 23/62* (2006.01)
*H01L 23/532* (2006.01)
*H01L 23/528* (2006.01)
*H01L 21/311* (2006.01)
*H01L 23/31* (2006.01)

(52) U.S. Cl.
CPC .. *H01L 21/76832* (2013.01); *H01L 21/76895* (2013.01); *H01L 22/22* (2013.01); *H01L 23/485* (2013.01); *H01L 23/5256* (2013.01); *H01L 23/5283* (2013.01); *H01L 23/53295* (2013.01); *H01L 23/62* (2013.01); *H01L 24/04* (2013.01); *H01L 24/05* (2013.01); *H01L 24/48* (2013.01); *H01L 21/31116* (2013.01); *H01L 23/3192* (2013.01); *H01L 24/13* (2013.01); *H01L 2224/03019* (2013.01); *H01L 2224/0401* (2013.01); *H01L 2224/04042* (2013.01); *H01L 2224/05009* (2013.01); *H01L 2224/05019* (2013.01); *H01L 2224/05083* (2013.01); *H01L 2224/05624* (2013.01); *H01L 2224/05647* (2013.01); *H01L 2224/13022* (2013.01); *H01L 2224/16145* (2013.01); *H01L 2224/16227* (2013.01); *H01L 2224/48463* (2013.01)

(58) Field of Classification Search
CPC ... H01L 2224/05019; H01L 2224/0508; H01L 2224/05082; H01L 2224/05083; H01L 2224/05559; H01L 2224/0558; H01L 2224/05582; H01L 2224/05583
See application file for complete search history.

(56) References Cited

U.S. PATENT DOCUMENTS

| | | | |
|---|---|---|---|
| 8,946,891 B1* | 2/2015 | Nangalia | H01L 24/11 257/737 |
| 2001/0004539 A1* | 6/2001 | Kirchhoff | H01L 23/5329 438/238 |
| 2002/0111009 A1* | 8/2002 | Huang | H01L 24/03 438/613 |
| 2007/0238304 A1 | 10/2007 | Wu | |
| 2009/0014843 A1* | 1/2009 | Kawashita | H01L 21/6835 257/621 |
| 2010/0230811 A1* | 9/2010 | Shin | H01L 24/05 257/737 |
| 2011/0254159 A1* | 10/2011 | Hwang | H01L 24/05 257/738 |

* cited by examiner

CONTACT HOLE STRUCTURE AND FABRICATING METHOD OF CONTACT HOLE AND FUSE HOLE

BACKGROUND OF THE INVENTION

1. Field of the Invention

The present invention generally relates to a contact hole and a fuse hole and method of forming the same. More particularly, the present invention relates to a method of preventing the damage of the conductive pad during the formation of a fuse hole.

2. Description of the Prior Art

With the miniaturization and higher degree of integration of semiconductor devices, semiconductor devices are more vulnerable to defects or impurities arising during manufacturing process. For example, a single deficient spot in the circuitry of a semiconductor chip such as metal discontinuity, via opening or electrical characteristic shifting of a diode or a transistor may cause the whole chip fail to function. To eliminate the problem aforesaid, it has been employed extensively in the field to incorporate fuses connecting to redundancy circuitries into the circuitry of a semiconductor chip. When a failure of the chip is defected and recognized, particular fuses may be deleted or opened to re-route circuitry along an alternate pathway, thereby repairing the chip.

It is a major tendency of the semiconductor industry to fabricate semiconductor devices having smaller dimension and better performance while consuming less electricity. The dimension of a semiconductor device may be minimized by forming highly integrated active devices or passive devices having smaller critical dimensions in the front-end manufacturing process and by forming effective electric interconnection between the chips or substrates in the back-end manufacturing process. The electric interconnection between the chips or substrates is usually achieved by forming a wire bond, a conductive bump or a solar ball in respective contact hole and contacting the conductive pad. The quality of the upper surface of the conductive pad exposed from the contact hole which interfaces the wire bond or the conductive bump would greatly influence the quality of the electric interconnection.

However, during the process of integrally forming the contact hole and the fuse hole, the upper surface of the conductive pad exposed from the contact hole usually suffers from un-desired corrosion or having residues remained thereon and results in poor quality of electric interconnection. Accordingly, there is still a need in the field to provide optimized structures and a method of forming contact holes and fuse holes which is able to avoid the aforesaid problems.

SUMMARY OF THE INVENTION

One objective of the present invention is to provide a novel method of integrally forming a contact hole and a fuse hole which is able to prevent the problem of conductive pad corrosion or residue.

According to one preferred embodiment of the present invention, a contact hole structure is provided. The contact hole structure includes a dielectric layer, a conductive pad disposed in the dielectric layer, a mask layer formed on the dielectric, a contact hole formed in the dielectric layer and the mask layer directly over the conductive pad and exposing the conductive pad, wherein the contact hole has a first portion and a second portion. The first portion is over the second portion and has a width larger than a width of the second opening.

According to another preferred embodiment of the present invention, a contact hole structure is provided. The contact hole structure includes a dielectric layer, a conductive pad disposed in the dielectric layer, a first trench formed in the dielectric layer, a second trench formed in the dielectric layer under the first trench and connected to the first trench. The first trench has a width larger than a width of the second trench. A photo-sensitive polyimide is formed on the dielectric layer and extending into the first trench along a sidewall of the first trench and thereby having a sidewall aligned with a sidewall of the second trench. The photo-sensitive polyimide and the second trench collectively form a contact hole exposing the conductive pad.

According to still another embodiment of the present invention, a method of fabricating a contact hole and a fuse hole is provided. First, a dielectric layer is provided having a conductive pad and a fuse formed therein. A first mask is then formed covering the dielectric layer and having a first opening directly over the conductive pad. Subsequently, a first removing process is performed using the first mask as a mask to remove a portion of the dielectric layer thereby forming a first trench. The conductive pad is directly under the first trench and none of the conductive pad is exposed form the first trench. After that, the first mask is removed and a second mask is formed covering the dielectric layer and having a second opening exposing the first trench and a third opening directly over the fuse. A second removing process is then performed using the second mask as a mask to remove the dielectric layer directly under the first trench and the dielectric layer directly over the fuse thereby forming a contact hole and a fuse hole respectively. The conductive pad is exposed form the contact hole.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figure 1:
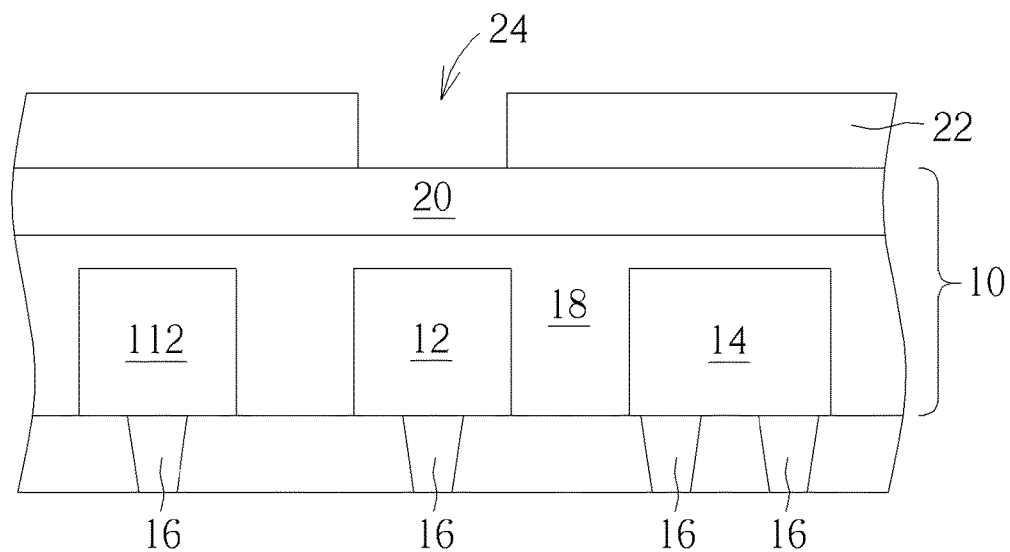
FIG. 1 to FIG. 4 are schematic diagrams illustrating the process of forming a contact hole and a fuse hole according to a first preferred embodiment of the present invention.

FIG. 1 to FIG. 4 are schematic diagrams illustrating the process of forming a contact hole and a fuse hole according to a first preferred embodiment of the present invention. As shown in FIG. 1, a chip (not shown) is provided. A dielectric layer 10 is formed on the chip. A conductive pad 12, a conductive pad 112 and a fuse 14 is formed in the dielectric layer 10. A metal interconnection 16 may be formed under the conductive pad 12, the conductive pad 112 and the fuse 14 to electrically connect the conductive pad 12, the conductive pad 112 and the fuse 14. The material of the conductive pad 12 and the conductive pad 112 may include aluminum, copper or other suitable metals. The material of the fuse 14 may include aluminum, copper or other suitable metals. The dielectric layer 10 may be a single-layered or multi-layered material layer and may include dielectric materials such as silicon nitride, silicon oxide or silicon oxynitride, but not limited thereto. According to a preferred embodiment, the dielectric layer 10 includes a first material layer 18 and a second material layer 20. The first material layer 18 is under the second material layer 20. The first material layer 18 may comprise silicon oxide. The second material 20 layer may comprise silicon nitride. The first material layer 18 may have a thickness of 100 micrometers (μm). The second material layer 20 may have a thickness of 80 μm. A first mask 22 is then formed to cover the dielectric layer 10. The first mask 22 has a first opening 24 directly over the conductive pad 12. The conductive pad 112 is completely covered by the first mask 22. Preferably, the first mask 22 may include photoresist, but not limited hereto. The first mask 22 may include other materials according to process needs.

Figure 2:
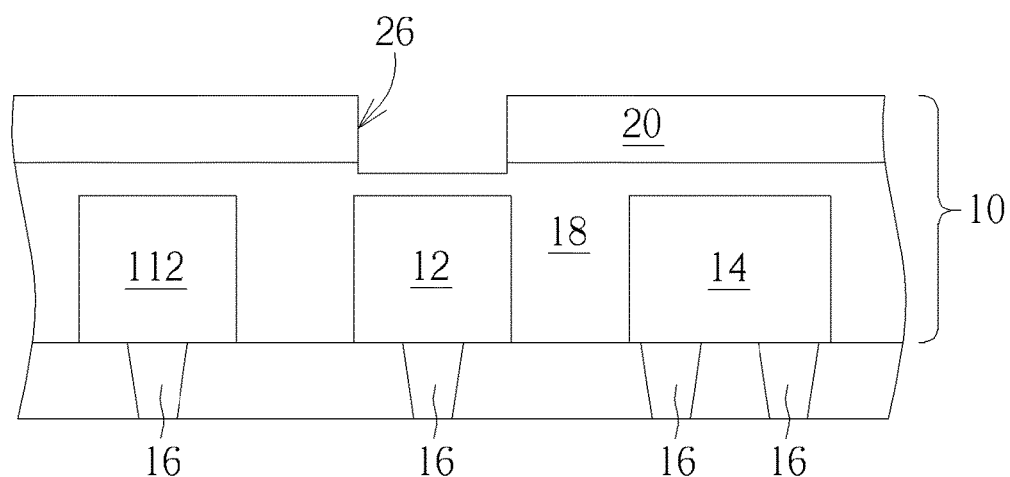

As shown in FIG. 2, a first removing process is performed using the first mask 22 as a mask to remove a portion of the dielectric layer 10 thereby forming a first trench 26. At this point, the conductive pad 12 is directly under the first trench 12 and is not exposed from the first trench 26 during the first removing process by being covered by a remaining portion the dielectric layer 10. In this embodiment, after the first removing process, a portion of the first material layer 18 is remained covering the conductive pad 12. According to a preferred embodiment, the thickness of the first material layer 18 covering the conductive pad 12 is approximately 2000 angstroms. After forming the first trench 26, the first mask 22 is then removed. Preferably, the first removing process is a dry etching process using etchants, for example, fluoride-containing etchants to etch away the first material layer 18 and the second material layer 20 of the dielectric layer 10. The fluoride-containing etchants may include, for example, $CHF_3$, $CF_4$, $C_4F_8$ and other organic floro-compounds.

Figure 3:
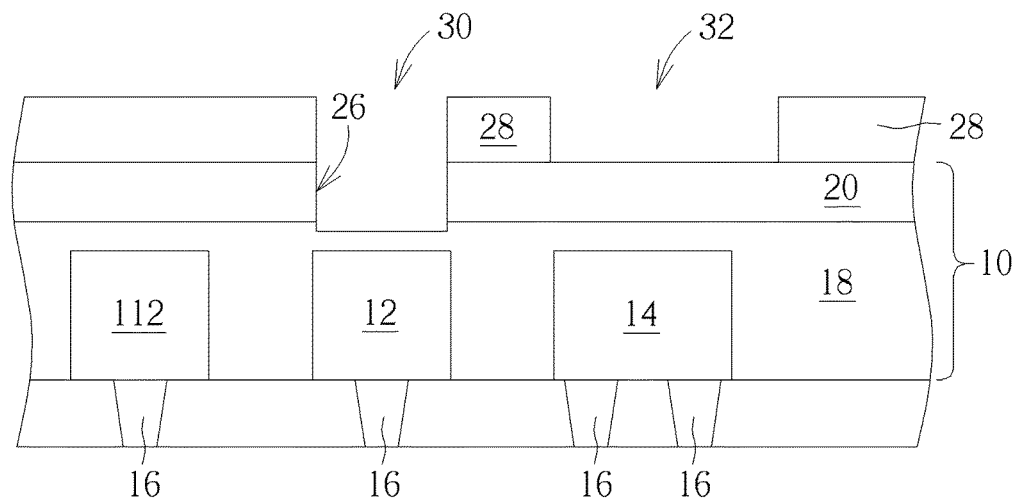

As shown in FIG. 3, after removing the first mask 22, a second mask 28 is formed covering the dielectric layer 10. The second mask 28 has a second opening 30 and a third opening 32. The second opening 30 exposes the first trench 26 and has a sidewall aligned with a sidewall of the first trench 26. The second mask 28 is not filled into the first trench 26. The third opening 32 is directly over the fuse 14. Preferably, the second mask 28 may include photo-sensitive polyimide, allowing the second opening 30 and the third opening 32 being formed by performing a photo-lithography process.

Figure 4:
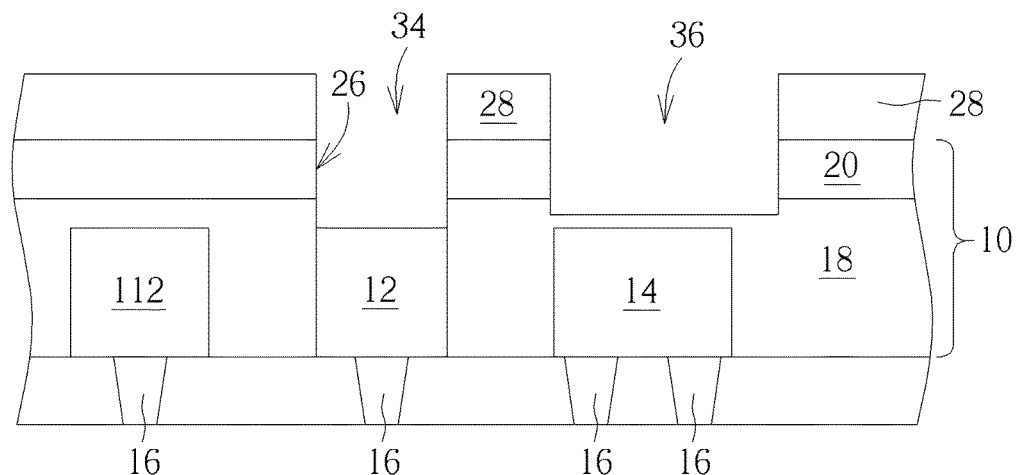

As shown in FIG. 4, a second removing process is then performed using the second mask 28 as a mask to remove the dielectric layer 10 directly under the first trench 26 and the dielectric layer 10 directly over the fuse 14 thereby forming a contact hole 34 and a fuse hole 36 respectively. After the second removing process, the conductive pad 12 is exposed from the contact hole 34 while the fuse 14 is still covered by the dielectric layer 10 which is thinned. Specifically, after the second removing process, the fuse 14 is covered by a remaining thickness of the first material layer 18. According to a preferred embodiment, for example, the remaining thickness of the first material layer 18 covering the fuse 14 is approximately 1500 angstroms. Furthermore, the contact hole 34 is defined by the dielectric layer 10 and the second mask 28 collectively, and the fuse hole 36 is also defined by the dielectric layer 10 and the second mask 28 collectively. At is process stage, the contact hole 34 and the fuse hole 36 according to the first preferred embodiment have been formed. The conductive pad 12 is exposed from the contact hole 34. The dielectric layer 10 and the second mask 28 directly over the conductive pad 112 remain un-etched. As shown in FIG. 4, the dielectric layer 10 directly over the fuse 14 has been thinned down. In the re-distribution process for re-routing or repairing the circuitry, the programming laser may be able to penetrate through the thinner dielectric layer 10 covering a certain fuse 14 to delete or open the fuse 14. Furthermore, the remaining dielectric layer 10 covering the fuse 14 may be able to protect the fuse 14 from oxidation before being programmed during the re-distribution process. It is noteworthy that the second mask 28 may be remained as a protecting layer for the device, protecting the device from being damaged by environmental radiations. Therefore, after forming the contact hole 34 and the fuse hole 36, the second mask 28 is preferably remained covering the dielectric layer 10. Furthermore, according to a preferred embodiment, the second removing process is a dry etching process using, for example, fluoride-containing etchants to etch away the first material layer 18 and the second material layer 20 of the dielectric layer 10. The fluoride-containing etchants may include, but not limited to, $CHF_3$, $CF_4$, $C_4F_8$ and other organic floro-compounds. The etchants used in the second removing process may include a mixture of organic floro-compounds and $NF_3$. The organic floro-compounds is used to increase the selectivity to the photo-sensitive polyimide, allowing the contact hole 36 having a flat bottom surface. The $NF_3$ is used to purge away by-products formed during the etching process. Furthermore, at a stage during the second removing process when the dielectric layer 10 over the conductive pad 12 has been removed and the conductive pad 12 has been exposed but the fuse hole 36 is not formed yet, optionally, $SF_6$ may be supplied into the etching chamber to form a protecting layer covering the exposed surface of the conductive pad 12. The protecting layer formed by $SF_6$ may prevent the conductive pad 12 being damaged when continuing the second removing process until the fuse hole 36 is formed. After forming the contact hole 34 and fuse hole 36, optionally, $N_2$, $H_2$, $O_2$, CO, $CO_2$ and He may be supplied into the etching chamber to remove the residual by-product on the dielectric layer 10 or the chip (not shown).

Subsequently, a wire bond (not shown) or a conductive bump (not shown) contacting the conductive pad 12 may be formed in the contact hole 34 according to product needs. The wire bond or the conductive bump is used to electrically connect the conductive pad 12 with another device, such as a chip, a circuit board or a semiconductor substrate.

Figure 5:
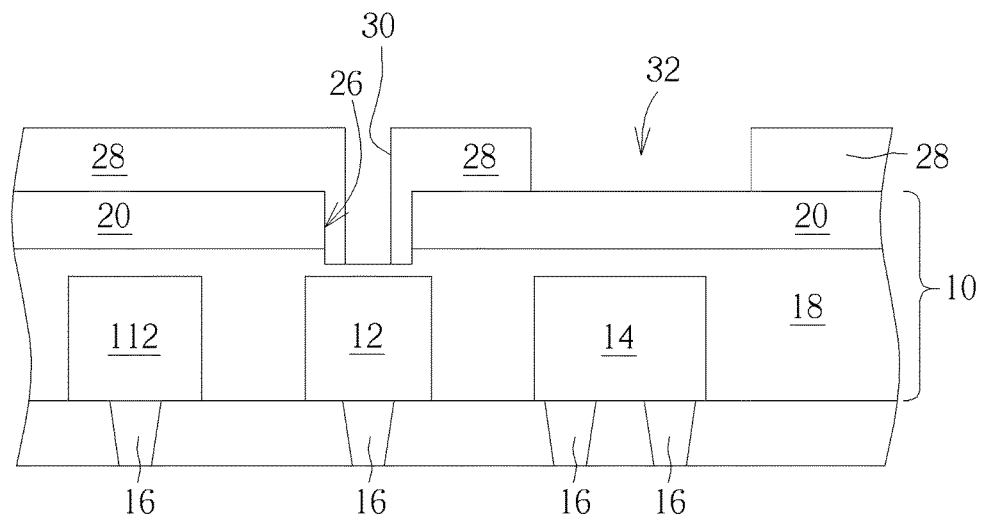
FIG. 5 and FIG. 6 are schematic diagrams illustrating the process of forming a contact hole and a fuse hole according to a second preferred embodiment of the present invention.

FIG. 1, FIG. 2, FIG. 5 and FIG. 6 are schematic diagrams illustrating the process of forming a contact hole and a fuse hole according to a second preferred embodiment of the present invention. For the sake of simplicity, like reference numerals are used to refer to the same material layers or process steps as described in the first preferred embodiment previously illustrated. The difference between the second preferred embodiment and the first preferred embodiment is that, in the second preferred embodiment, the second mask 28 extends into the first trench 26 along the sidewall of the first trench 26 and the second opening 30 is formed within the first trench 26. The steps as shown in FIG. 1 and FIG. 2 of the second preferred embodiment are the same as the first embodiment and will not be narrated herein. Please refer to FIG. 5 which illustrates the step after FIG. 2, after forming the first trench 26 and removing the first mask 22, a second mask 28 is formed covering the dielectric layer 10 and extending into the first trench 26 along the sidewall of the first trench 26 thereby forming the second opening 30 within the first trench 26. That is, the second mask 28 contacts the sidewall of the first trench 26. The second opening 30 has a width smaller than a width of the first trench 26. As shown in FIG. 5, similarly, the second mask 28 further has a third opening 32 directly over the fuse 14.

Figure 6:
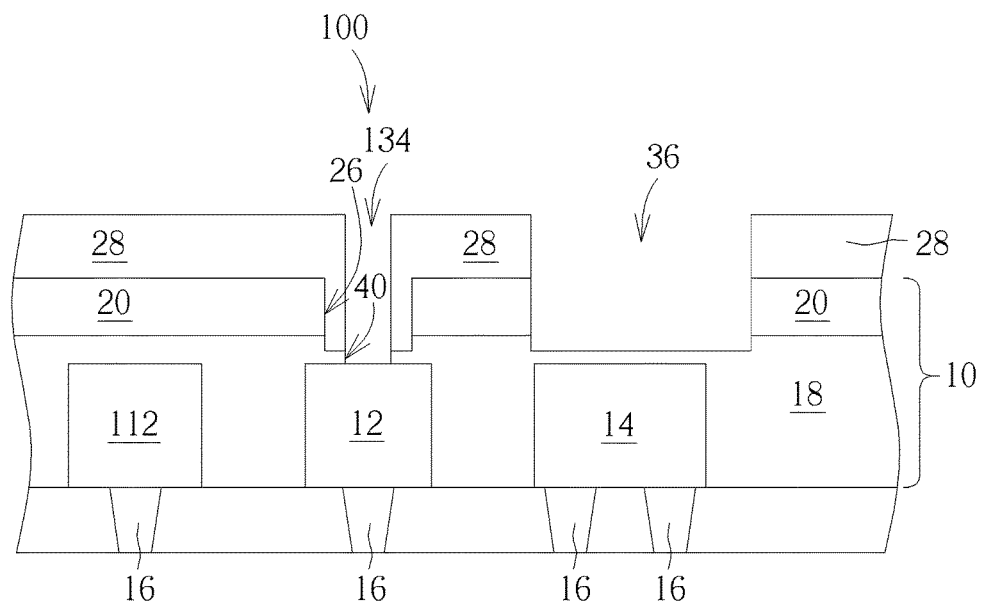
Figure 7:
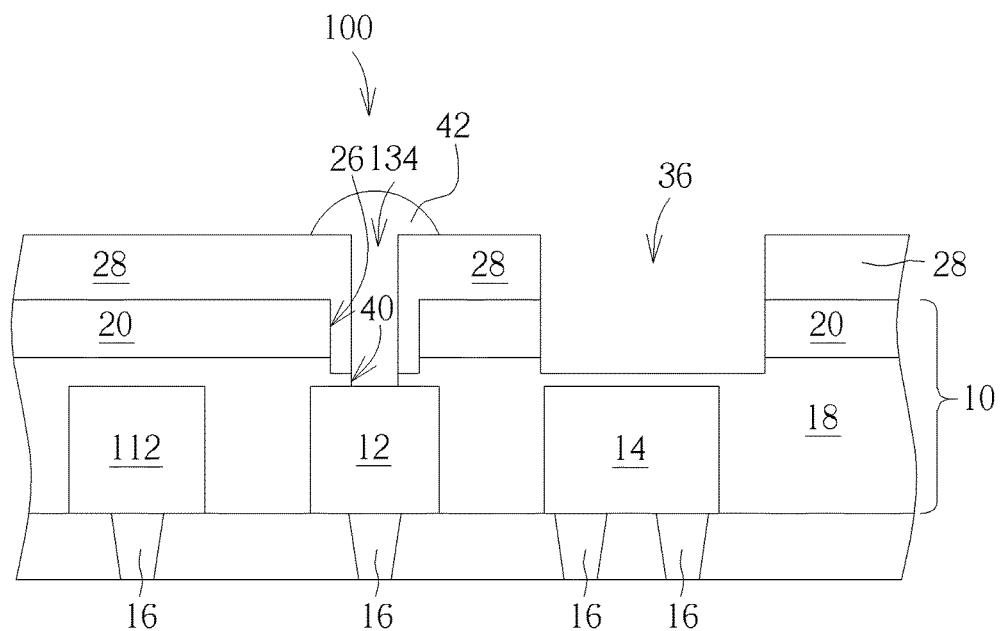
FIG. 7 is a schematic diagram illustrating forming a conductive bump in the contact hole formed by the process according to the second preferred embodiment.

As shown in FIG. 6, a second removing process is then performed using the second mask 28 as a mask to remove the dielectric layer 10 from the second opening 30 and the third opening 32 thereby forming a second trench 40 directly over the conductive pad 12 and a fuse hole 36 directly over the fuse 14 respectively. In the second preferred embodiment, the contact hole 134 is defined by the second mask 28 and the second trench 40 in the dielectric layer 10 collectively. That is, in the second preferred embodiment, the contact hole 134 and the fuse hole 36 are both obtained in the second removing process. It is noteworthy that the sidewall of the second mask 28 is aligned with the sidewall of the second trench 40. Specifically, the second trench 40 is formed in the first material layer 18, and the sidewall of the second trench 40 and the sidewall and the bottom of the first trench 26 collectively form a step profile. The etchants used in the second preferred embodiment and detailed etching stages are the same as illustrated in the first preferred embodiment and would not be narrated herein. Furthermore, the remaining thickness of the dielectric layer 10 covering the fuse 14 is also the same as in the first preferred embodiment. Subsequently, please refer to FIG. 7, a conductive bump 42 is formed in the contact hole 134. The conductive bump 42 is used to electrically connect the conductive pad 12 to another device, such as a chip, a circuit board or a semiconductor substrate, but not limited hereto. As shown in FIG. 7, preferably, the second mask 28 remains covering the dielectric layer 10 after forming the conductive bump 42. The conductive bump 42 may be replaced with a wire bond according to product needs.

Figure 8:
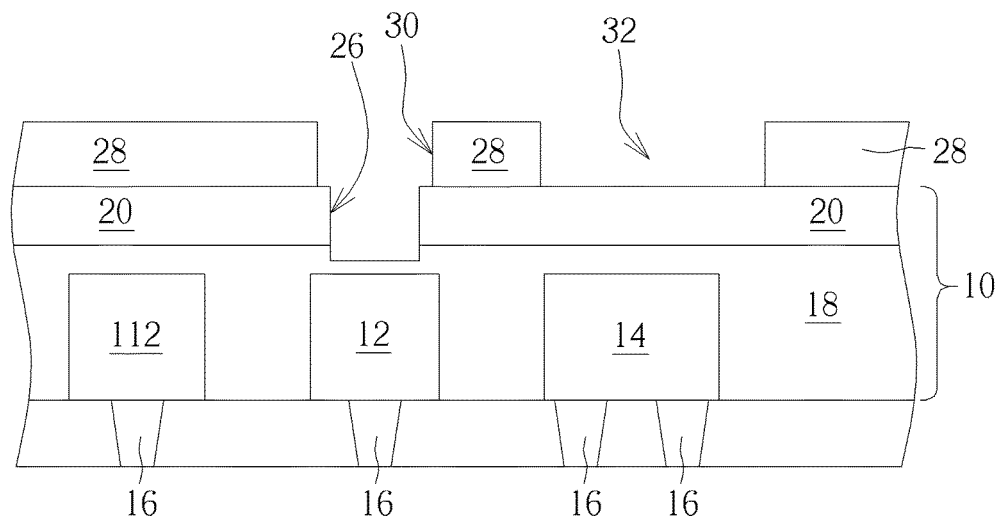
FIG. 8 and FIG. 9 are schematic diagrams illustrating the process of forming a contact hole and a fuse hole according to a third preferred embodiment of the present invention.

FIG. 1, FIG. 2, FIG. 8 and FIG. 9 are schematic diagrams illustrating the process of forming a contact hole and a fuse hole according to a third preferred embodiment of the present invention. For the sake of simplicity, like reference numerals are used to refer to the same material layers or process steps as described in the first preferred embodiment previously illustrated. The difference between the third preferred embodiment and the first preferred embodiment is that, in the third preferred embodiment, the second opening 30 formed in the second mask 28 has a width larger than a width of the first trench 36, and the first trench 26 is exposed from the second opening 30. The steps as shown in FIG. 1 and FIG. 2 of the third preferred embodiment are the same as the first embodiment and will not be narrated herein. Please refer to FIG. 8 which illustrates the step after the step as shown in FIG. 2, after forming the first trench 26 and removing the first mask 22, a second mask 28 is formed covering the dielectric layer 10. The second mask 28 have a second opening 30 having a width larger than a width of the first trench 26 thereby exposing a portion of the upper surface of the dielectric layer 10. As shown in FIG. 8, similarly, the second mask 28 further has a third opening 32 directly over the fuse 14.

Figure 9:
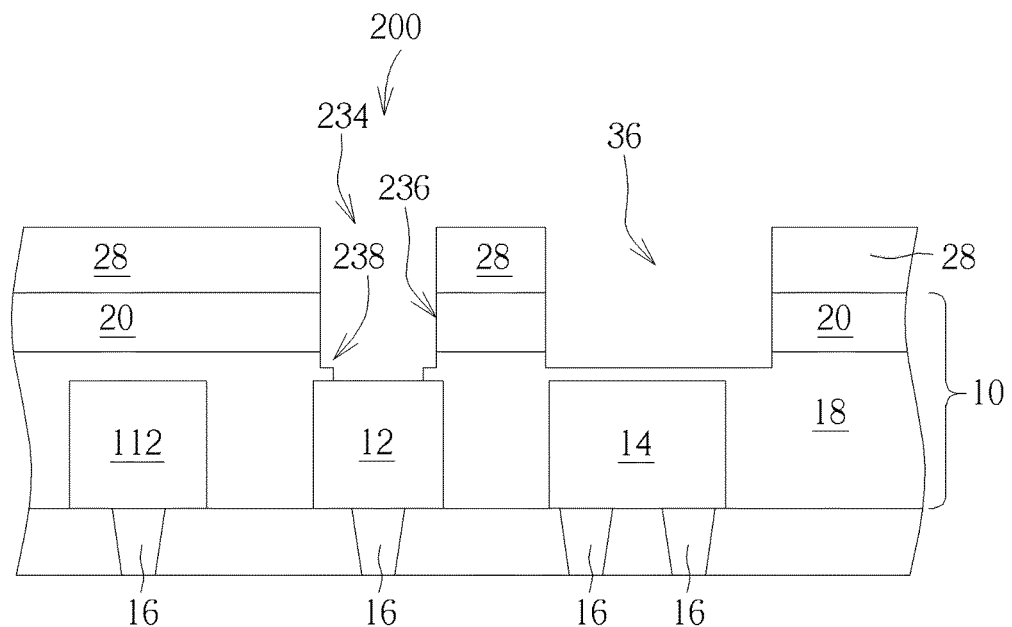

As shown in FIG. 9, a second removing process is then performed using the second mask 28 as a mask to remove a portion of the dielectric layer 10 and thereby a contact hole 234 and a fuse hole 36 are obtained. In the third preferred embodiment, the contact hole 234 is defined by the second mask 28 and the dielectric layer 10 collectively. The etchants used in the third preferred embodiment and detailed etching stages in the third preferred embodiment are the same as the first preferred embodiment and would not be narrated herein. Furthermore, the thickness of the remaining dielectric layer 10 covering the fuse 14 in the third preferred embodiment is also the same as in the first preferred embodiment. Subsequently, please refer to FIG. 10, a wire bond 38 is formed in the contact hole 234. The wire bond 38 is used to electrically connect the conductive pad 12 to another device, such as a chip, a circuit board or a semiconductor substrate, but not limited hereto. The wire bond 38 may be replaced with a conductive bump according to product needs.

Please refer back to FIG. 6. As shown in FIG. 6, the contact hole structure 100 according to the second preferred embodiment includes a dielectric layer 10 and a conductive pad 12 formed in the dielectric layer 10. The dielectric layer 10 may be a single-layered or multi-layered material layer. The dielectric layer 10 may include dielectric materials such as silicon nitride, silicon oxide and silicon oxynitride, but not limited hereto. According to a preferred embodiment, the dielectric layer 10 is a multi-layered material layer including a first material layer 18 and a second material layer 20. The first material layer 18 and the second material layer 20 have different materials. For example, the first material layer 18 is preferably silicon oxide and the second material layer 20 is preferably silicon nitride. A first trench 26 and a second trench 40 are formed in the dielectric layer 10. The second trench 40 is directly under the first trench 26 and connected with the first trench 26. The first trench 26 has a width larger than a width of the second trench 40. A second mask 28, such as a photo-sensitive polyimide layer, is formed on the dielectric layer 10 and extending into the first trench 26 thereby having a sidewall aligned with a sidewall of the second trench 40. The second mask 28 and the second trench 40 collectively form the contact hole 134 which exposes the conductive pad 12. The second trench 40 is formed in the first material layer 18 and the first trench 26 is formed in the first material layer 18 and the second material layer 20. A conductive bump, as shown in FIG. 7, may be formed in the contact hole 134 and contacting the conductive pad 12.

Figure 10:
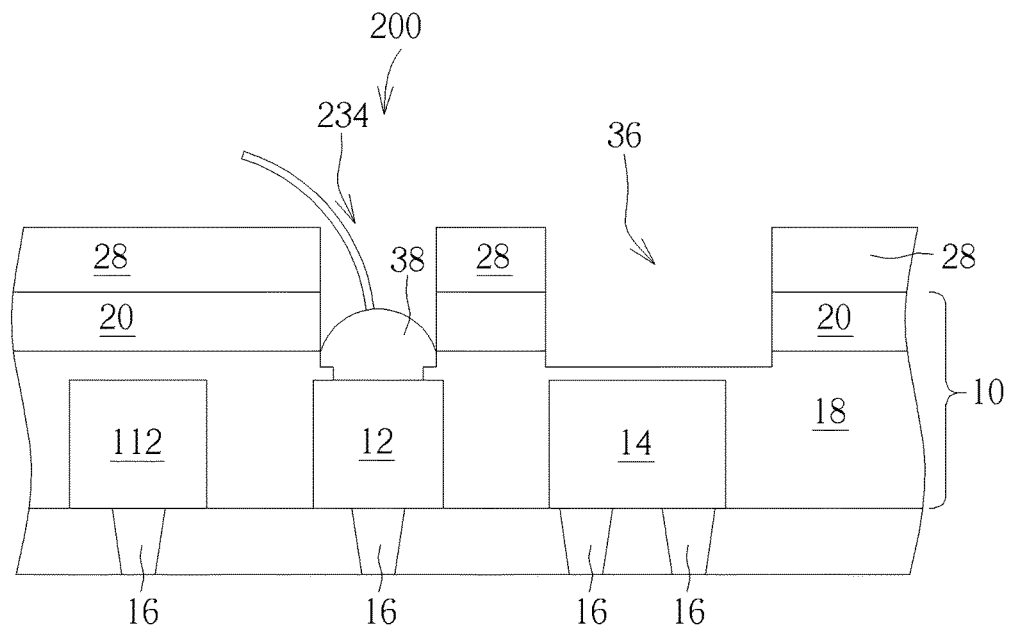
FIG. 10 is a schematic diagram illustrating forming a wire bond in the contact hole formed by the process of the process according to the third preferred embodiment.

Please refer to FIG. 9. As shown in FIG. 9, the contact hole structure 200 according to the third embodiment of the present invention includes a dielectric layer 10. The dielectric layer 10 may be a single-layered or multi-layered material layer comprising dielectric materials such as silicon nitride, silicon oxide and silicon oxynitride, but not limited hereto. According to a preferred embodiment of the present invention, the dielectric layer 10 includes a first material layer 18 and a second material layer 20. A conductive pad 12 is formed in the dielectric layer 10. A second mask 28 is formed on the dielectric layer 10. A contact hole 234 is formed in the dielectric layer 10 and the second mask 28, and the contact hole 234 is directly over the conductive pad 12 and exposing the conductive pad 12 therefrom. The contact hole 234 includes a first portion 236 and a second portion 238. The first portion 236 is above the second portion 238 and has a width larger than a width of the second portion 238. The first portion 236 is formed in the second mask 28, the first material layer 18 and the second material layer 20. The second portion 238 is formed only in the first material layer 18 of the dielectric layer 10. Furthermore, the sidewall of the second portion 238, the sidewall of the first portion 236 and the upper surface of the first material layer 18 collectively form a step profile. Preferably, the second mask 28 may comprise photo-sensitive polyimide. A wire bond 38, as shown in FIG. 10, may be formed in the contact hole 234 and contacts the conductive pad 12.

It is one feature of the present invention that during the first removing process, the etching depth of the dielectric layer is intentionally and carefully controlled to only partially remove the dielectric layer over the conductive pad. The remaining dielectric layer on the conductive pad after the first removing process is then removed and the conductive pad is therefore exposed during the second removing process to form the fuse. In comparison with conventional method of forming the contact hole, the method provided by the present invention prevents the conductive pad from being exposed to the etchants during the first removing process and consequently the overall exposure period of the conductive pad to the etchant is reduced and the un-desired loss of the conductive pad or corrosion of the exposed surface of the conductive pad is minimized.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a dielectric layer, comprising a silicon oxide layer and a silicon nitride layer over the silicon oxide layer;
   a conductive pad disposed in the dielectric layer;
   a mask layer disposed on the dielectric layer; and
   a contact hole formed in the dielectric layer and the mask layer, the contact hole being directly over the conductive pad and exposing the conductive pad, wherein the contact hole comprises a first portion and a second portion, wherein the first portion is over the second portion and has a width larger than a width of the second portion.

2. The semiconductor structure according to claim 1, wherein the mask layer comprises photo-sensitive polyimide.

3. The semiconductor structure according to claim 1, wherein the first portion of the contact hole is formed through the whole thicknesses of the mask layer and the silicon nitride layer and through a portion of the thickness of the silicon oxide layer.

4. The semiconductor structure according to claim 1, further comprises a conductive bump or a wire bond formed in the contact hole and electrically connecting the conductive pad.

5. The semiconductor structure according to claim 1, wherein the dielectric layer comprises a planar top surface.

6. The semiconductor structure according to claim 1, further comprising:
   a fuse disposed in the dielectric layer; and
   a fuse hole formed in the dielectric layer and the mask layer and being directly over the fuse, wherein the fuse is not exposed from the fuse hole by being covered by a thickness of the dielectric layer.

7. A semiconductor structure, comprising:
   a dielectric layer;
   a conductive pad disposed in the dielectric layer;
   a first trench formed in the dielectric layer;
   a second trench formed in the dielectric layer, the second trench being under the first trench and connecting the first trench, wherein the first trench has a width larger than a width of the second trench;
   a photo-sensitive polyimide layer formed on the dielectric layer, extending into the first trench and having a sidewall aligned with a sidewall of the second trench, wherein the photo-sensitive polyimide layer and the second trench collectively forms a contact hole exposing the conductive pad; and
   a conductive bump or a wire bond formed in the contact hole and electrically connecting the conductive pad.

8. The semiconductor structure according to claim 7, wherein the dielectric layer comprises a silicon oxide layer and a silicon nitride layer over the silicon oxide layer.

9. The semiconductor structure according to claim 8, wherein the first trench is formed through the whole thicknesses of the silicon nitride layer and through a portion of the thickness of the silicon oxide layer.

10. The semiconductor structure according to claim 7, wherein the dielectric layer comprises a planar top surface.

11. The semiconductor structure according to claim 7, further comprising:
    a fuse disposed in the dielectric layer; and
    a fuse hole formed in the dielectric layer and the photo-sensitive polyimide layer and being directly over the fuse, wherein the fuse is not exposed from the fuse hole by being covered by a thickness of the dielectric layer.

* * * * *